United States Patent [19]

Tsuchida et al.

[11] Patent Number: 5,708,453

[45] Date of Patent: Jan. 13, 1998

[54] RAMP SIGNAL PRODUCING METHOD, RAMP SIGNAL PRODUCING APPARATUS, AND LIQUID CRYSTAL DRIVE/DISPLAY APPARATUS

[75] Inventors: Susumu Tsuchida, Tokyo; Yoshihide Nagatsu, Kanagawa, both of Japan

[73] Assignee: Sony Corporation, Tokyo, Japan

[21] Appl. No.: 600,729

[22] Filed: Feb. 13, 1996

[30] Foreign Application Priority Data

Feb. 28, 1995 [JP] Japan ................................. 7-040900

[51] Int. Cl.[6] .................................................. H03K 13/02
[52] U.S. Cl. ........................... 345/87; 341/126; 345/84; 345/98; 345/112; 345/147; 377/45; 377/118; 377/125
[58] Field of Search .............................. 341/50, 118, 126; 377/45, 59, 118, 125; 345/84, 89, 98, 112, 147, 185, 87

[56] References Cited

U.S. PATENT DOCUMENTS

| | | | |
|---|---|---|---|
| 3,656,148 | 4/1972 | Belchen et al. | 340/324 A |
| 3,742,482 | 6/1973 | Albrecht et al. | 340/324 |
| 4,267,728 | 5/1981 | Manley et al. | 73/172 |
| 4,363,025 | 12/1982 | Jackson | 340/347 |

*Primary Examiner*—Mark R. Powell
*Assistant Examiner*—Vincent E. Kovalick
*Attorney, Agent, or Firm*—Jay H. Maioli

[57] ABSTRACT

In a ramp signal producing apparatus, a ramp signal is produced under low clock signal frequency in a compact circuit arrangement. Luminance control and a white balance control are carried out by the ramp signal in a liquid crystal display. The ramp signal producing apparatus is comprised of: an up/down counter for either counting up, or counting down a clock signal supplied thereto; amplitude amount converting means for converting the amplitude of the supplied clock signal into such an amplitude value corresponding to the count value of the up/down counter and for converting the amplitude value in such a manner that a change amount per one count value is increased during the count down operation by the up/down counter; and ramp signal producing means for producing such a ramp signal with an amplitude corresponding to the converted amplitude value.

6 Claims, 9 Drawing Sheets

RAMP SIGNAL PRODUCING METHOD, RAMP SIGNAL PRODUCING APPARATUS, AND LIQUID CRYSTAL DRIVE/DISPLAY APPARATUS

BACKGROUND OF THE INVENTION

1. Field of the Invention

The present invention relates to a ramp signal producing method for producing a ramp signal to drive a liquid crystal display, and to a ramp signal producing apparatus. The present invention also relates to a liquid crystal drive apparatus for driving a liquid crystal display in response to the ramp signal produced from the ramp signal producing apparatus, and to a liquid crystal display apparatus for displaying an image on the liquid crystal display.

2. Description of the Related Art

In a liquid crystal display apparatus, there are provided a liquid crystal display in which transparent electrodes are arranged in a matrix form to constitute pixels, an image signal driver for driving electrodes of the respective pixels of the liquid crystal display every horizontal line at image signal levels of the respective pixels, and a horizontal driver for driving the respective pixels of the liquid crystal display for each of the horizontal lines. The image is displayed on the respective pixels of the horizontal lines sequentially driven by the horizontal driver in response to the image signals for the respective pixels, whose levels are supplied from the image signal driver.

The horizontal driver drives the respective pixels by employing such a ramp signal having an asymmetrical trapezoidal shape, in which falling time is shorter than rising time. As a result, the respective pixels of the liquid crystal display are quickly discharged to erase the after images caused by the picture signal in the preceding frame. The extremely sharp rising edge as well as falling edge of this ramp signal are not produced in order to avoid deterioration of the liquid crystal display, or malfunction thereof during the drive operation.

The above-described ramp signal is produced by such a ramp signal producing apparatus constructed of an up/down counter for counting up a clock signal in the rising time and for counting down the clock signal in the falling time, and a ramp signal producing means for modulating the frequency of the clock signal multiplied by "m" during the falling time and for varying the amplitude of the clock signal in response to the count value of the up/down counter.

For instance, in the case that the count value is constructed of 7 bits and the amplitude of the ramp signal is variably set to 128 stages of analog voltage values by this ramp signal producing apparatus, when the D/A conversion time for the count signal is selected to be 17 μs (microseconds), 128 pieces of burst clocks having the frequency of 7.5 MHz are required during the count up operation by the up/down counter. When the clock frequency of the clock signal is multiplied by four to produce the burst clock having the frequency of 30 MHz during the count down operation, the oscillation frequency of 60 MHz is required as the continuous clock.

Also, the white balance control and the offset value control are required so as to control the non-linear characteristic of luminance (brightness) based upon the non-linear characteristic of the transmittance characteristic of the liquid crystal display with respect to the applied voltage value. When the image signal level is represented by, for example, 258 gradation, the image signal level at the straight line portion may have resolution of 8 bits. However, the image signal level at the non-linear portion owns only resolution of 8 bits or less. Therefore, since the sensitivity of the half tone portion such as a grey portion becomes insufficient, this resolution of the non-linear portion must be increased four times higher than that of the straight line portion, namely resolution of 8 bits or more. Under such circumstances, the image signal level should own resolution of 10 bits.

On the other hand, when the clock frequency of the above-described ramp signal producing apparatus is selected to be 60 MHz, the logic circuits such as the up/down counter employed in this ramp signal producing apparatus must be fabricated in accordance with the very fine semiconductor manufacturing processes available for the high frequency operation. This may cause a high cost problem. Also, since the high frequency interference caused by the spurious radiation of the high frequency components contained in such a 60 MHz clock signal may occur in the VHF broadcasting band, even when the beat phenomenon would be suppressed by the shield member or the like, there is another problem that such high frequency interference cannot be completely eliminated. For instance, since 183.25 MHz corresponding to the video (picture) carrier frequency of the VHF 8 channel in the Japanese TV system is present around 180 MHz equal to the three-time higher harmonic of the 60 MHz clock frequency. Accordingly, the beat phenomenon should be seriously suppressed by the shielding means.

Also, in the case that the resolution of the image signal level is increased so as to control the white balance, the signal processing bit numbers of the A/D converter, the digital image signal processing circuit, and the ramp signal producing apparatus should be increased in order to improve the resolution. This A/D converter A/D-converts the image signal supplied to the liquid crystal display apparatus into the digital image signal. As a consequence, there is another problem that a large-scaled circuit arrangement is required and thus the manufacturing cost thereof would be increased.

OBJECT AND SUMMARY OF THE INVENTION

The present invention has been made to solve the above-described problems, and therefore, has an object to provide a ramp signal producing method for producing a ramp signal to drive a liquid crystal display and a ramp signal producing apparatus capable of sufficiently performing a luminance (brightness) control and a white balance without making a large-scaled circuit diagram, while a frequency of a clock signal need not be converted or modulated into a higher frequency. Another purpose of the present invention is to provide a liquid crystal drive apparatus for driving a liquid crystal display in response to the above-described ramp signal, and a liquid crystal display apparatus for displaying an image on this liquid crystal display.

To achieve the object, a ramp signal producing method, according to the present invention, is comprised of: a count step for counting up or down a supplied clock signal; an amplitude amount converting step for converting the amplitude of the supplied clock signal into an amplitude value in accordance with the count value of the count step and for converting the amplitude value in such a manner that a change amount per one count value is increased during the count down step; and a ramp signal producing step for producing a ramp signal whose amplitude is varied in response to the amplitude value.

In the amplitude amount converting step, the count value is shifted in a bit mode during the count down step so as to increase the count value, whereby the change amount of the amplitude value is increased.

In the amplitude amount converting step, the amplitude values for the respective count values are read out from an amplitude value memory into which the amplitude values for the respective count values have been stored during the count up step and the count down step in such a manner that the amplitude value with respect to the count value is increased during the count down operation in the count step.

Also, a ramp signal producing apparatus, according to the present invention, is comprised of: an up/down counter for either counting up, or counting down a clock signal supplied thereto; amplitude amount converting means for converting the amplitude of the supplied clock signal into such an amplitude value corresponding to the count value of the up/down counter and for converting the amplitude value in such a manner that a change amount per one count value is increased during the count down operation by the up/down counter; and ramp signal producing means for producing such a ramp signal with an amplitude corresponding to the converted amplitude value.

The amplitude amount converting means includes bit shift means for shifting the count value in a bit shift mode during the count down operation by the up/down counter so as to increase the count value, whereby the change amount of the amplitude value is increased.

The amplitude amount converting means includes an amplitude value memory into which the amplitude values for the respective count values have been stored during the count up operation by the up/down counter and the count down operation thereby, and reads out the amplitude values from the amplitude value memory with respect to the respective count values.

A liquid crystal drive apparatus, according to the present invention, is comprised of: an up/down counter for either counting up, or counting down a clock signal supplied thereto; amplitude amount converting means for converting the amplitude of the supplied clock signal into such an amplitude value corresponding to the count value of the up/down counter and for converting the amplitude value in such a manner that a change amount per one count value is increased during the count down operation by the up/down counter; ramp signal producing means for producing such a ramp signal with an amplitude corresponding to the converted amplitude value; and drive means for driving a liquid crystal display in an image signal level produced by clipping the supplied image signal based on the ramp signal.

The amplitude amount converting means includes bit shift means for shifting the count value in a bit shift mode during the count down operation by the up/down counter so as to increase the count value, whereby the change amount of the amplitude value is increased.

The amplitude amount converting means includes an amplitude value memory into which the amplitude values for the respective count values have been stored during the count up operation by the up/down counter and the count down operation thereby, and reads out the amplitude values from the amplitude value memory with respect to the respective count values.

The amplitude amount converting means includes an S-shaped correction memory for previously storing therein a correction value used to correct the amplitude of the ramp signal in order that an S-shaped correction of the liquid crystal display is carried out during the count up operation by the up/down counter, and the amplitude value of the ramp signal is corrected based upon the correction value stored in the S-shaped correction memory.

The amplitude amount converting means includes an adder for adding an offset value to the amplitude value of the ramp signal, by which a white balance is carried out, and the offset value is added to the amplitude value in the adder so as to correct the white balance of the ramp signal.

The amplitude amount converting means includes an adder for adding an offset value to the amplitude value of the ramp signal, by which a luminance (brightness) correction is carried out, and the offset value is added to the amplitude value in the adder so as to correct the luminance (brightness) of the ramp signal.

The drive means is arranged by a charge hold type D/A converter.

A liquid crystal display apparatus, according to the present invention, is comprised of: an up/down counter for either counting up, or counting down a clock signal supplied thereto; amplitude amount converting means for converting the amplitude of the supplied clock signal into such an amplitude value corresponding to the count value of the up/down counter and for converting the amplitude value in such a manner that a change amount per one count value is increased during the count down operation by the up/down counter; ramp signal producing means for producing such a ramp signal with an amplitude corresponding to the converted amplitude value; drive means for driving in an image signal level produced by clipping the supplied image signal based on the ramp signal; and a liquid crystal display driven by the drive means to display an image thereon.

The amplitude amount converting means includes bit shift means for shifting the count value in a bit shift mode during the count down operation by the up/down counter so as to increase the count value, whereby the change amount of the amplitude value is increased.

The amplitude amount converting means includes an amplitude value memory into which the amplitude values for the respective count values have been stored during the count up operation by the up/down counter and the count down operation thereby, and reads out the amplitude values from the amplitude value memory with respect to the respective count values.

The liquid crystal display is a plasma addressed liquid crystal display.

In accordance with the ramp signal producing method of the present invention, when the count down operation is carried out in the amplitude amount converting step, the switching operation is performed in such a manner that the amount of amplitude changes is increased with respect to the count value, and in the ramp signal producing step, the ramp signal whose amplitude is varied in response to this count value.

Also, in accordance with the ramp signal producing apparatus of the present invention, while the count down operation is performed by the up/down counter, the amplitude amount converting means selects that the amount of amplitude changes with respect to the count value of this up/down counter are increased, so that such a ramp signal whose amplitude is varied in response to this count value is produced by the ramp signal producing means. As described above, when the count down operation is carried out, the clock signal supplied to the up/down counter need not be modulated by the high frequency.

According to the liquid crystal drive apparatus of the present invention, the amplitude of the ramp signal is corrected by the S-shaped correction as the linear shape by the amplitude amount converting means, so that the resolution of the image signal level is increased, and both of the white balance and the luminance of the image signal levels can be controlled based upon the offset value.

Also, in accordance with the liquid crystal display apparatus of the present invention, while the count down operation is performed by the up/down counter, the amplitude amount converting means selects that the amount of amplitude changes with respect to the count value of this up/down counter are increased, so that such a ramp signal whose amplitude is varied in response to this count value is produced by the ramp signal producing means. The amplitude of the ramp signal is corrected by the S-shaped correction as the linear shape by the amplitude amount converting means, so that the resolution of the image signal level is increased, and both of the white balance and the luminance of the image signal levels can be controlled based upon the offset value.

BRIEF DESCRIPTION OF THE DRAWINGS

For a better understanding of the present invention, reference is made of the detailed description to be read in conjunction with the accompanying drawings, in which.

DETAILED DESCRIPTION OF THE PREFERRED EMBODIMENT

Referring now to drawings, a description will be made of a liquid crystal display apparatus according to a preferred embodiment of the present invention.

The liquid crystal display apparatus according to the present invention is a liquid crystal display apparatus used in, for example, a wall-mounted type television and a slim type television for multimedia purposes, in which a suitable image signal is displayed on a liquid crystal display.

Figure 1:
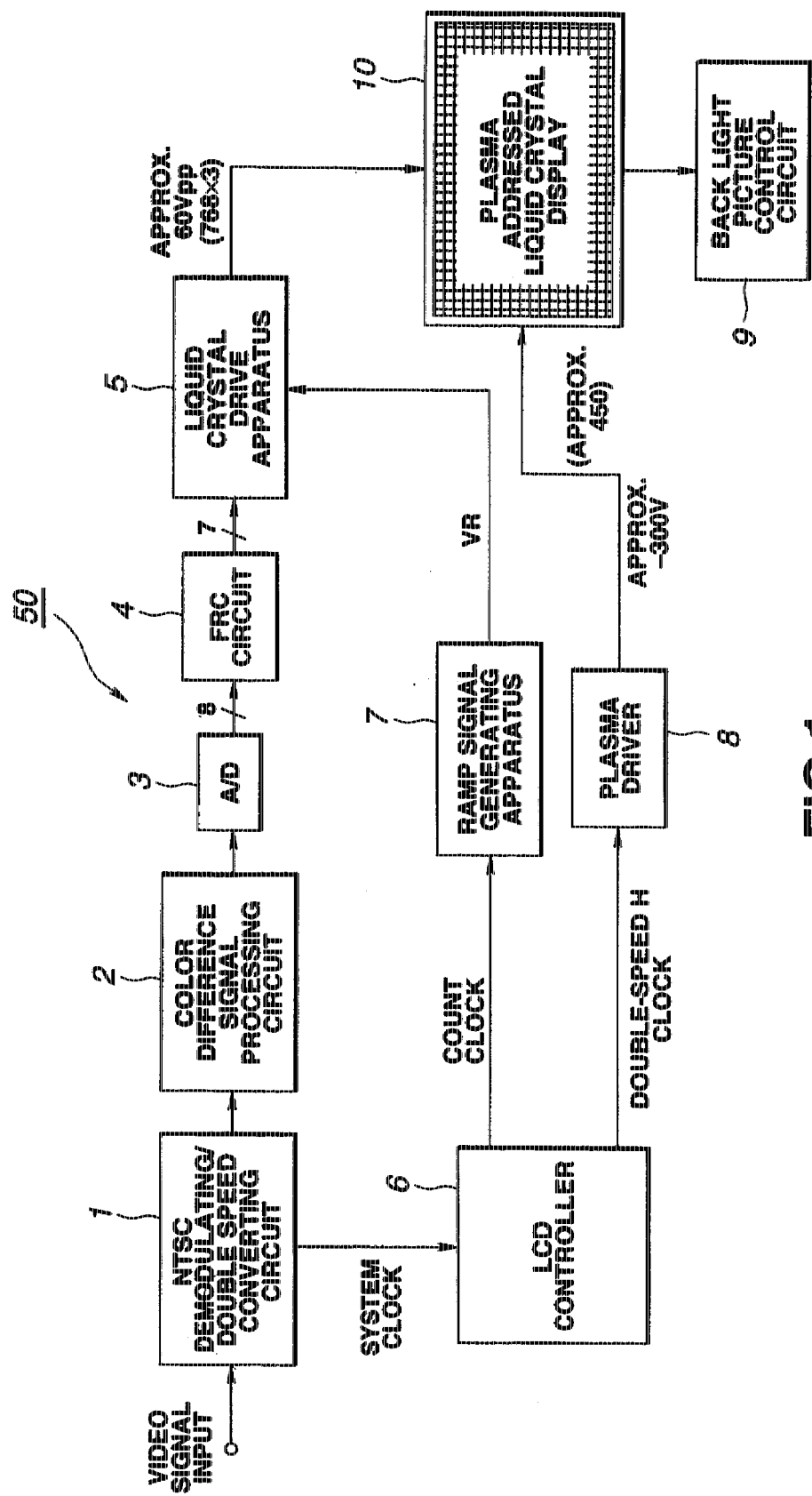
FIG. 1 is a schematic block diagram for showing a liquid crystal display apparatus according to a first embodiment of the present invention.

The above-described liquid crystal display apparatus is comprised of, as indicated in FIG. 1, an NTSC demodulating/double speed converting circuit 1 to which an image (video) signal is supplied, a color difference signal processing circuit 2 for converting the video signal supplied from the NTSC demodulating/double speed converting circuit 1 into RGB signals, an A/D converter 3 for A/D-converting the RGB signals supplied from the color difference signal processing circuit 2 into the corresponding RGB digital signals, an FRC circuit 4 for converting the frame rate of the RGB digital signals derived from the A/D converter 3, and a liquid crystal display drive apparatus 5 for driving the respective pixels of an plasma addressed liquid crystal display (will be referred to as a "PALC" hereinafter) 10 for each of the horizontal lines in response to the RGB signals supplied from the FRC circuit 4. This liquid crystal display apparatus is further arranged by an LCD controller 8 for producing a clock signal in synchronism with the video signal supplied from the NTSC demodulating/double speed converting circuit 1, a ramp signal producing apparatus 7 for producing a ramp signal in response to the clock signal, a plasma driver 8 for driving the respective pixels of the PALC 10 every horizontal line in response to this clock signal, a back light picture control circuit 9 for controlling or adjusting illuminance of back light of the PALC 10, and also the PALC (plasma addressed liquid crystal display) 10 driven by the above-explained liquid crystal drive apparatus 5 and plasma driver 8, and for displaying an image thereon while controlling illuminance of the back light by the picture control circuit 9.

To the NTSC demodulating/double speed converting circuit 1, an NTSC composite video (picture) signal is supplied from an UV tuner for an UHF broadcasting system, an UV tuner for a VHF broadcasting system, or a BS tuner for a BS broadcasting system.

This NTSC demodulating/double speed converting circuit 1 includes a demodulating unit for demodulating the NTSC composite picture signal to produce a luminance signal and for demodulating this NTSC composite picture signal based on the luminance signal to produce color difference signals, a frame memory for storing the color difference signals every frame, a detecting unit for detecting movements of a picture from the color difference signal stored in this frame memory, and an interpolation processing unit for interpolating the color difference signals based upon the detection result of the movement detecting unit. In a still picture region where no movement is detected by the movement detecting unit, the color difference signals are continuously read from the frame memory at a double speed. In a moving picture region where movement is detected by the movement detecting unit, the color difference signals are inner-interpolated based on the picture signal levels of the upper/lower horizontal scanning lines and then are read at a double speed. These inner-interpolated/read color difference signals are converted into non-interlace signals of 525 H/80 Hz which will then be supplied to the color difference signal processing circuit 2. Also, both of the non-interlace signals and the luminance signal demodulated by the demodulating unit are supplied to the LCD controller 8.

The color difference processing circuit 2 controls color hue of the color difference signals supplied from the NTSC demodulating/double speed converting circuit 1, and performs the inverse-matrix conversion to the resultant color difference signals to thereby produce the RGB signals.

In the A/D converter 3, the picture signal levels of the RGB signals supplied from the color difference signal processing circuit 2 are A/D-converted in 8-bit quantizing precision.

In the FRC circuit 4, the rounding process is carried out to the least significant bit (LSB) of the RGB signals digitalized in the 8-bit quantizing precision, which are supplied from the A/D converter 3, thereby obtaining RGB signals quantized by 7 bits.

Figure 2:
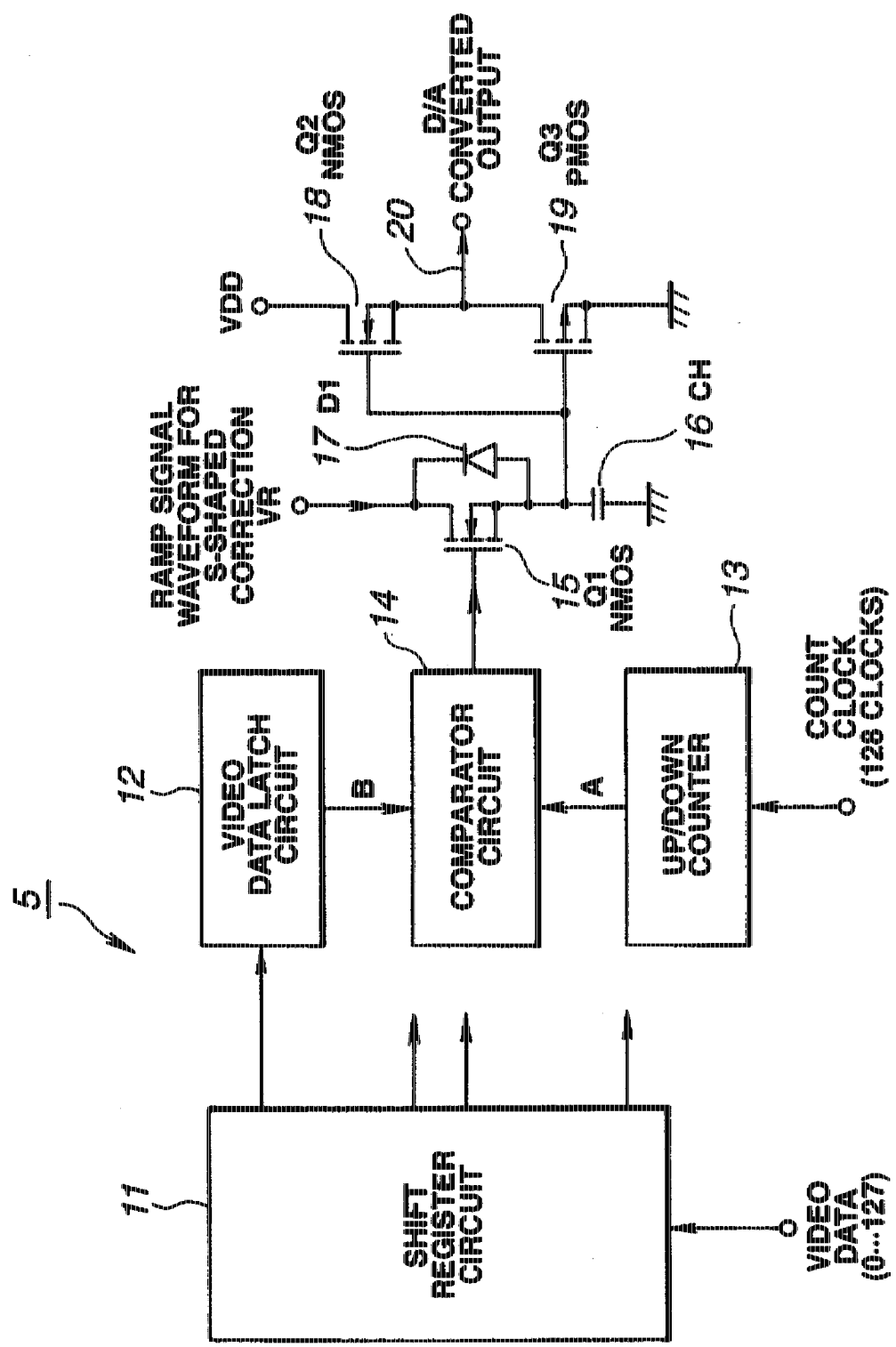
FIG. 2 is a schematic block diagram for indicating a major portion of a liquid crystal drive apparatus according to the present invention.

As represented in FIG. 2, the liquid crystal drive apparatus 5 is arranged by a shift register circuit 11 for sequentially shifting the RGB signals of 768 pixels for 1 horizontal line, supplied from the FRC circuit, a latch circuit 12 for latching the RGB signals for the respective pixels, furnished from the shift register circuit 11, and an up/down counter 13 for counting up/down the clock signal derived from the LCD controller 6. The liquid crystal drive apparatus 5 further includes a comparator circuit 14 for outputting a HIGH signal from starting of the counting operation of the up/down counter 13 until the count value of the up/down counter 13 becomes higher than the level of the picture signal supplied from the latch circuit 12, an N type transistor 15 having a gate to which the comparator output from the comparator circuit 14 is supplied and having a drain to which the ramp signal is supplied from the ramp signal generating apparatus 7, a capacitor 16 whose one end is connected to the source of the N type transistor 15 and whose the other end is connected to the ground, and a diode 17 whose anode is connected to the drain of the N type transistor 15 and whose cathode is connected to the source of this N type transistor 15. Also, the liquid crystal drive apparatus 5 contains another N type transistor 18 having a gate connected to the cathode of the diode 17, a drain to which the power is supplied from the power supply, and a source connected to an output terminal 20, and a P type transistor 19 having a drain connected to the output terminal 20, a source connected to the ground, and a gate connected to the cathode of the diode 17. From this output terminal 20, the drive signal is outputted.

The capacitor 18 charge-holds the signal levels of the RGB picture signals supplied from the latch circuit 12.

In the liquid crystal drive apparatus 5, the signal levels of the respective RGB image signals having the 7-bit resolution and supplied from the FRC circuit 4 are formed in 128 gradations. While the count number corresponding to the image signal levels stored in the latch circuit 12 is counted by the up/down counter 13, the capacitor 18 is charged at the voltage value of this image signal level clipped by the ramp signal produced from the ramp signal producing apparatus and the voltage value charged in this capacitor 18 is outputted as the drive signal from the output terminal 20. It should be noted that this liquid crystal drive apparatus 5 functions as a drive means.

Figure 3:
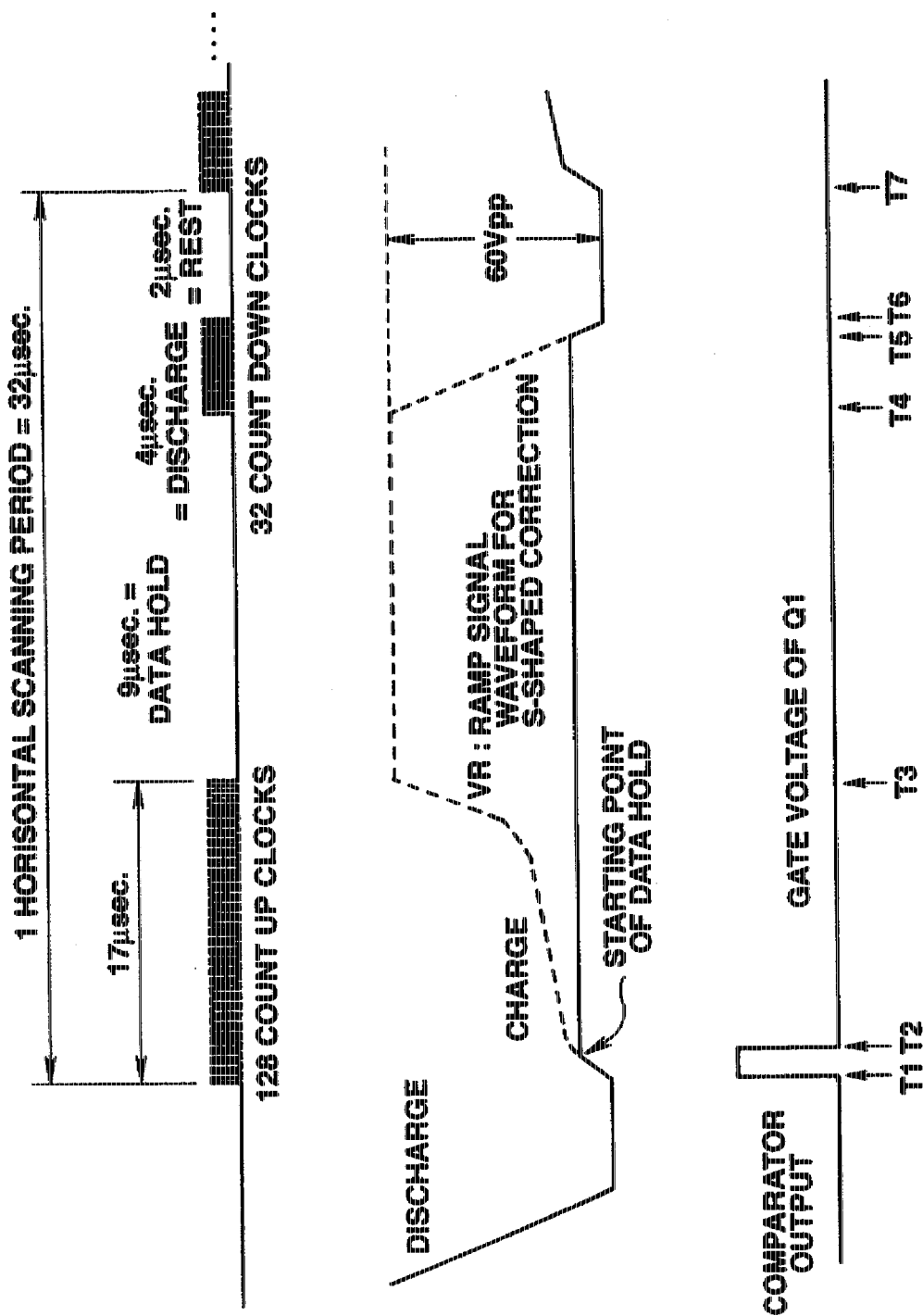
FIG. 3 represents a waveform chart of signals produced from a major portion of a ramp signal producing apparatus according to the present invention.

Next, operations of the liquid crystal drive apparatus 5 when the drive signal is produced will now be explained with reference to FIG. 3.

At time "T1," the level of the image signal, for example, level 10 is previously stored in the latch circuit 12, and the output signal from the comparator 14 becomes HIGH signal at the same time when the counting operation by the up/down counter 13 is commenced. The charging operation of the capacitor 18 at the voltage value of this image signal level clipped by the ramp signal produced by the ramp signal producing apparatus 7 is commenced. The charged voltage is outputted as the drive signal from the output terminal 20.

At time "T2," when 10 pieces of the clock signals among 128 pieces of the clock signals are counted by the up/down counter 13, the output signal from the comparator LOW signal, so that the N type transistor 15 is turned OFF, and the charging operation of the capacitor 18 at the signal level of the image signal clipped by the ramp signal is complete. Thus, this charged power is held by the capacitor 16, and then the charged voltage is outputted as the drive signal from the output terminal At time "T3," the charging period of 17 μs is ended, and the voltage value of the image signal level charged in the capacitor 18 and clipped by the ramp signal is held so that the transparent electrode of the PALC 10 is driven.

At time "T4," the hold period of 9 μs is accomplished, and the 32 values counted by the up/down counter 13 are commenced to be counted down.

At time "T5," the discharge period is commenced in which the counted value of the up/down counter 13 is less than 10 and the capacitor 18 is discharged.

At time "T6," the counted value of the up/down counter 13 becomes 0, so that the count down by the up/down counter 13 and the discharge operation by the capacitor 18 are complete.

At time "T7," the operation of one horizontal line is ended after the rest period of 2 μs, and then the operation of the subsequent horizontal line is commenced.

Figure 4:
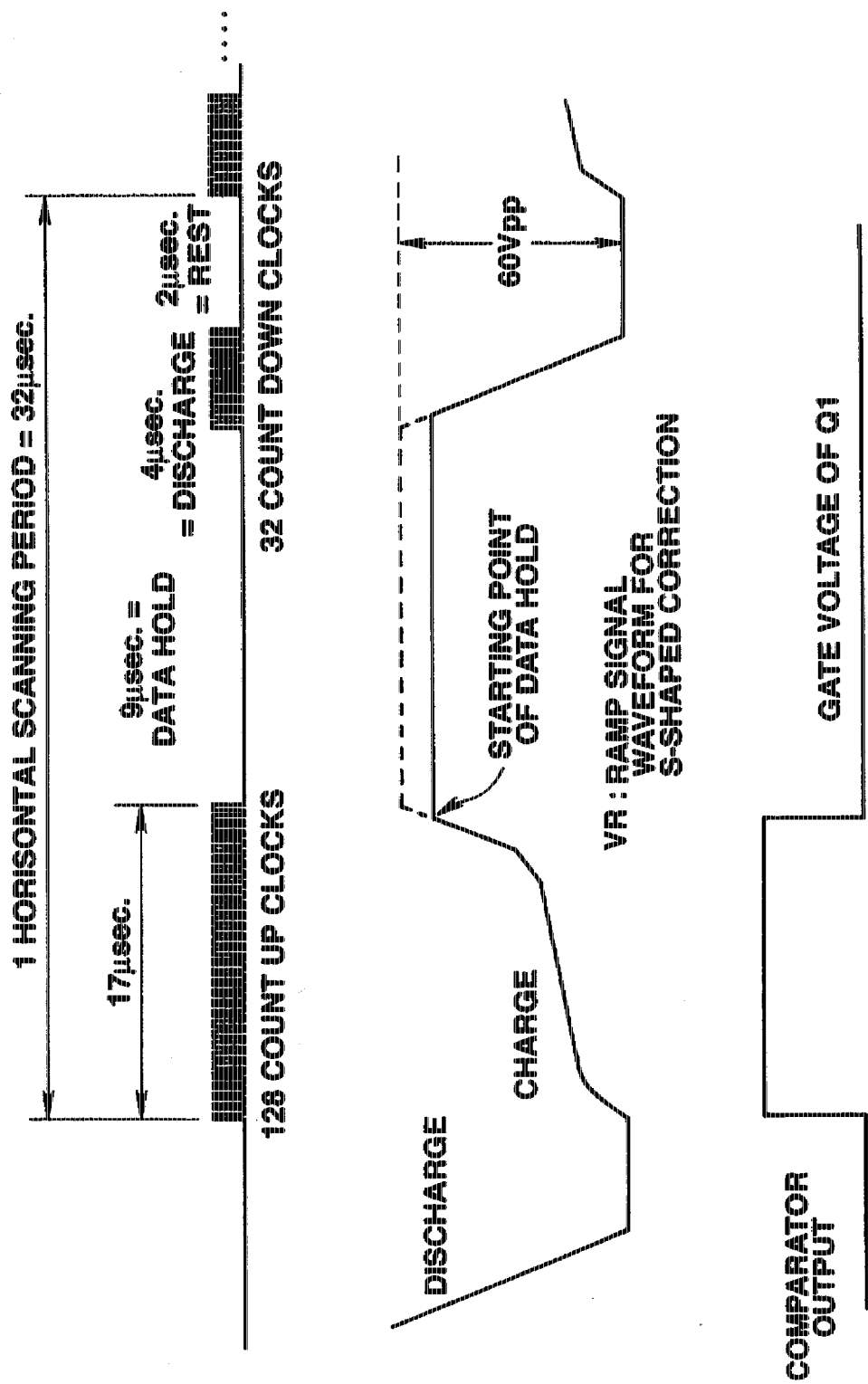
FIG. 4 shows a waveform chart of signals by other count value produced from the major portion of the ramp signal producing apparatus shown in FIG. 3.

In the liquid crystal drive apparatus 5, as shown in FIG. 4, during the subsequent horizontal line, the luminance value 128 of the full scale is previously stored in the latch circuit 12, and the capacitor 16 is charged while the counted value of the up/down counter 13 becomes from 1 to 128, and then a similar operation to that of the preceding horizontal line is carried out.

The liquid crystal drive apparatus 5 with the above-described circuit arrangement may function as a charge/hold type D/A converter which charges and holds the 7-bit image signal with the 128-gradation image information supplied from the FRC circuit 4 at the signal level of the analog image signal clipped by the ramp signal produced from the ramp signal producing apparatus 7.

This liquid crystal drive apparatus 5 supplies the voltage values of the analog RGB image signals to the transparent electrodes of the respective pixels of the PALC 10 on which the red, blue and green polarization filters have been provided for the respective horizontal lines. These analog RGB image signals are produced by D/A-converting the RGB image signals supplied from the FRC circuit 4.

The LCD controller 6 produces the count clock signal based on the luminance signals of the PALC 10 for the respective pixels, supplied from the NTSC demodulating/ double speed converting circuit 1, and also produces a double-speed H clock signal based upon the non-interlace signal. Then, this LCD controller 6 furnishes the count clock signal to the ramp signal producing apparatus 7 and the double-speed H clock signal to the plasma driver 8.

Figure 5:
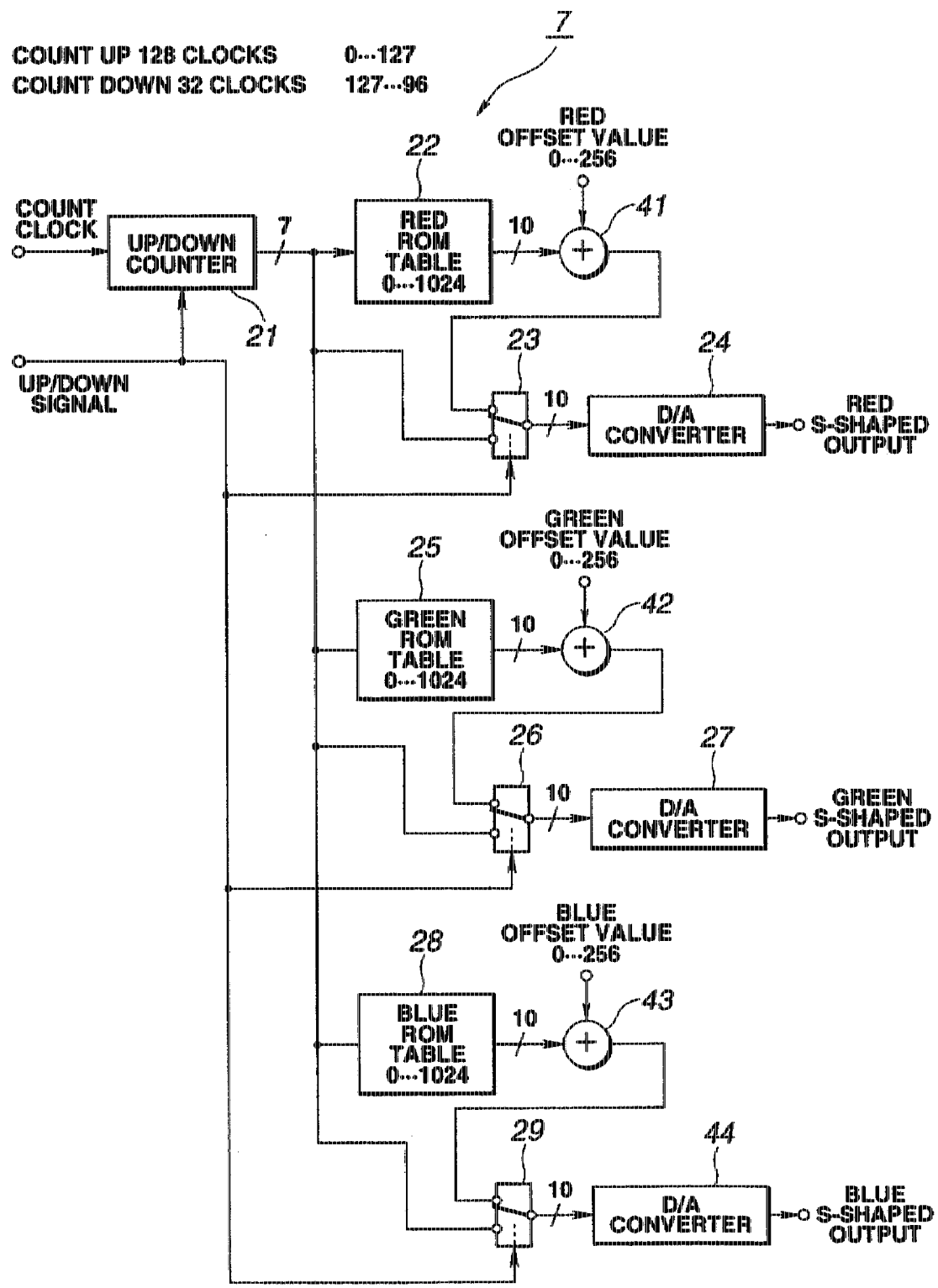
FIG. 5 is a schematic block diagram for indicating a major portion of the liquid crystal drive apparatus shown in FIG. 2.

As indicated in FIG. 5, the ramp signal producing apparatus 7 includes an up/down counter 21 for counting up the count clock signal supplied from the LCD controller 8 when the up/down signal is in the HIGH state and for counting down this count clock signal when the up/down signal is in the LOW state; red/green/blue ROM tables 22/25/28 for previously storing the corrected image signals which are obtained by correcting the respective RGB image signal levels of the respective pixels in accordance with the count value of the up/down counter 21; and adders 41/42/43 for adding the respective RGB offset values of the respective pixels with respect to the count values to the corrected image signals read from the red/green/blue tables 22/25/28. The ramp signal producing apparatus further includes switches 23/26/29 for sending out the output signals of the adders 41/42/43 when the up/down signal is in the HIGH state, and also for sending out the output signal from the up/down counter 21 when the up/down signal is in the LOW state, and also D/A converters 24/27/44 for D/A-converting the output signals from the switches 23/26/29 into the analog output signals which will then be supplied as the ramp signal to the liquid crystal drive apparatus 5.

The above-explained up/down signal is formed in such a manner that during the charge period and the hold period in the each horizontal period, this up/down signal is in the HIGH state, whereas during the discharge period and the charge period in the each horizontal period, this up/down signal is in the LOW state.

The up/down counter 21 counts up the count clock derived from the LCD controller 6 while the up/down signal is in the HIGH state, and holds the count value after the count up operation. When the up/down signal is in the LOW state, the up/down counter 21 shifts the count value expressed by the binary notation by 2 bits to the MSB side so as to multiply the count value four times. While the change amount of the amplitude per 1 count clock is multiplied four times, the up/down counter 21 counts down this held count value every time the count clock signal is supplied thereto. This up/down counter 21 may function as the up/down counter and an amplitude amount converting means.

Figure 6:
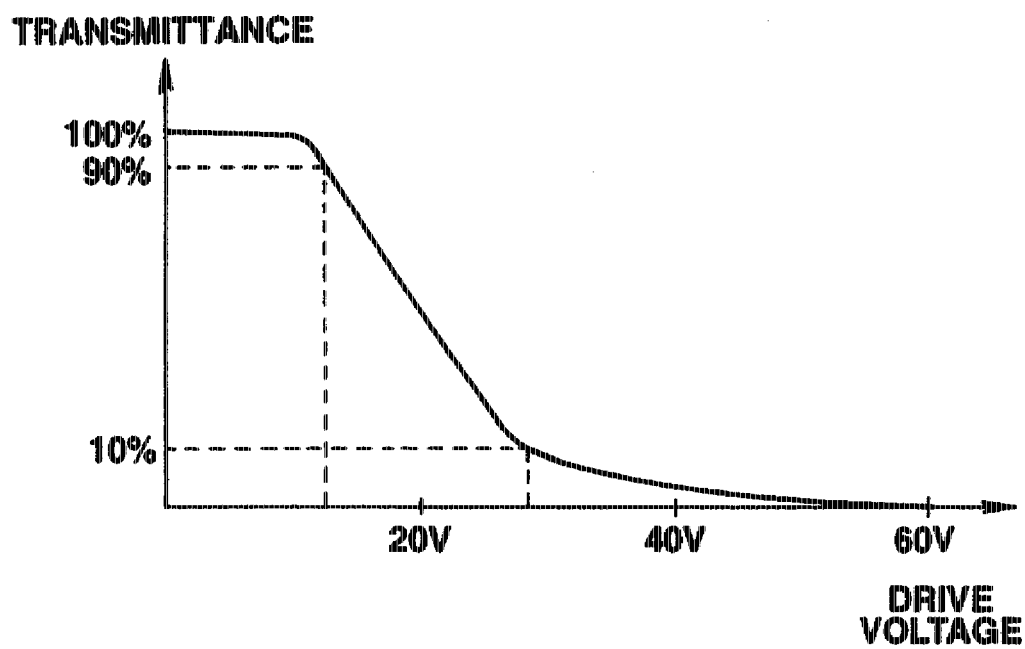
FIG. 6 is a characteristic diagram for indicating a transmittance characteristic of a liquid crystal display employed in the liquid crystal display apparatus of FIG. 1 with respect to an applied voltage value thereto.
Figure 7:
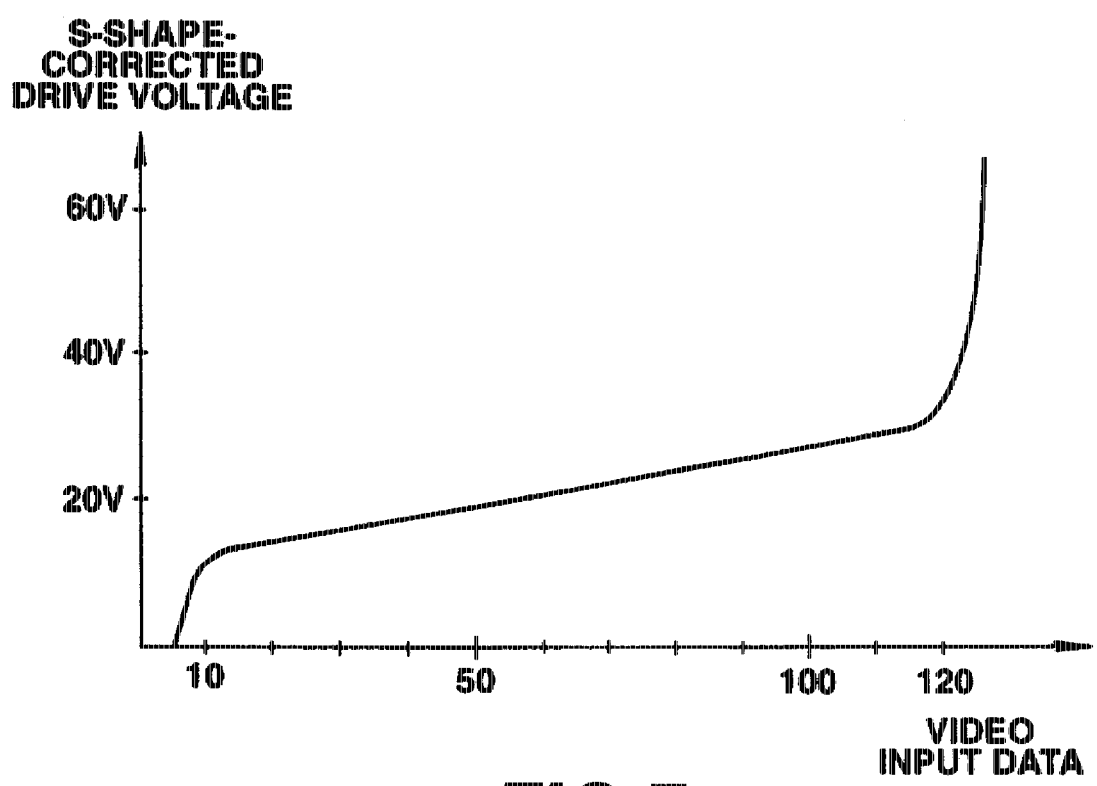
FIG. 7 is a waveform chart for showing an S-shaped correction waveform used to correct the transmittance characteristic of the liquid crystal display of FIG. 6.
Figure 8:
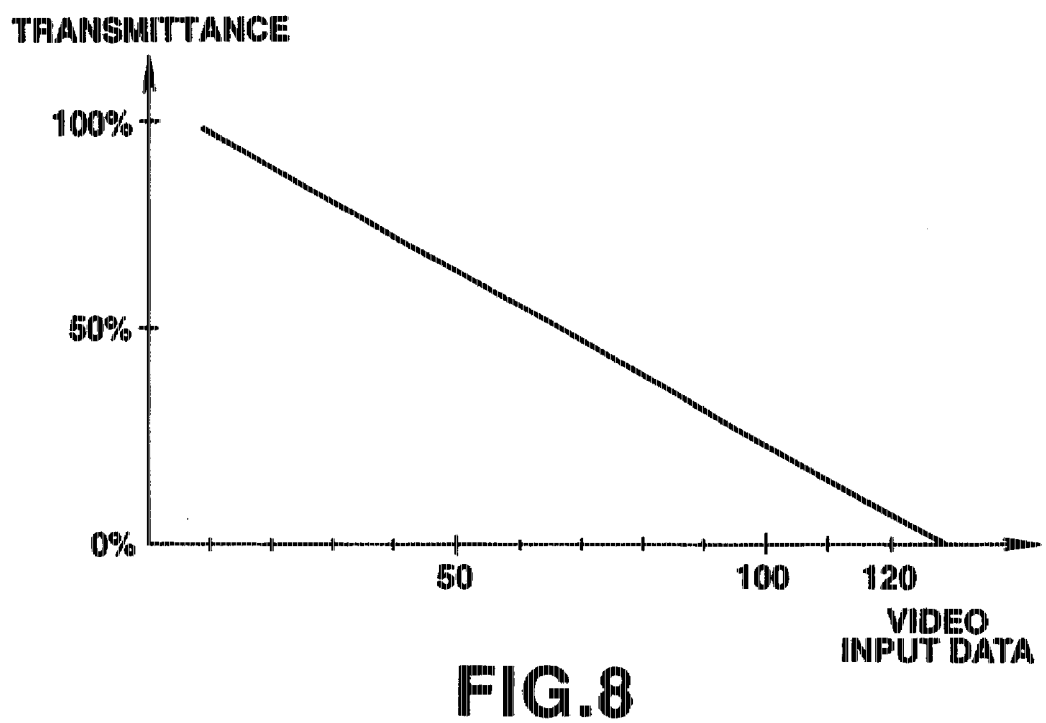
FIG. 8 is a characteristic diagram for indicating a transmittance characteristic of the liquid crystal display corrected by the above-explained S-shaped correction waveform.

In the red ROM table 22, the corrected image signals as to the respective applied voltages are stored, these corrected image signals are produced as follows. As indicated in FIG. 6, a transmittance characteristic of red light of the liquid crystal display unit of the PALC 10 with respect to the applied voltage is multiplied by such a voltage indicative of the S-shaped characteristic with regard to this applied voltage (see FIG. 7), so that the transmittance of the red light with respect to this applied voltage is set to such a linear characteristic as shown in FIG. 8 and thus, the image signal level becomes high resolution. This red ROM table 22 may function as an amplitude value memory of the amplitude amount converting means and the S-shaped correction memory.

In the green and blue ROM tables 25 and 28, the corrected image signals as to the respective applied voltages are stored, these corrected image signals are produced as follows. As indicated in FIG. 6, a transmittance characteristic of green and blue lights of the liquid crystal display unit of the PALC 10 with respect to the applied voltage is multiplied by such a voltage indicative of the S-shaped characteristic with regard to this applied voltage (see FIG. 7), so that each of the transmittance of the green and blue lights with respect to this applied voltage is set to such a linear characteristic as shown in FIG. 8 and thus, the image signal level becomes high resolution. The green and blue ROM tables 25 and 28 may function as an amplitude value memory of the amplitude amount converting means and the S-shaped correction memory.

To control the white balance and the luminance levels of the RGB signals, offset values preselected to the adders 41, 42 and 43 are supplied to the adders 41, 42, 43, respectively. These adders 41, 42, 43 may function as the amplitude amount converting means.

The D/A converters 24, 27, 44 may function as the ramp signal producing means.

In the ramp signal producing apparatus 7 with the above-described circuit arrangement, when the frequency of the clock count signal is selected to be, for example, 7.5 MHz, the counting time for 128 pieces of the clock count signals is 17 μs during the count up operation, whereas the counting time for 32 pieces of the clock count signals is 4 μs during the count down operation. Accordingly, the discharging period of the liquid crystal drive apparatus 5 is less than ¼ of the charging period thereof. This ramp signal producing apparatus 7 may function as the ramp signal producing means.

As described above, in accordance with the ramp signal producing apparatus 7, the frequency of the clock signal supplied to the up/down counter during the count down operation may be set to such a low frequency equal to the frequency of the clock signal during the count up operation. As a consequence, this ramp signal producing apparatus 7 can be manufactured in low cost by employing the usual semiconductor manufacturing process whose manufacturing steps are small. Also, no spurious radiation is emitted from the ramp signal producing apparatus 7 to make up the high quality image of the liquid crystal display apparatus. Further, since the structure for cutting the spurious radiation is no longer required, the overall arrangement can be made cheap and simple.

In the ramp signal producing apparatus 7, the image signal level is corrected by the S-shaped correcting manner based upon the corrected image signals stored in the red/green/blue ROM tables 22/25/28, so that the transmittance characteristic of the PALC 10 is made linear and thus the resolution of the image signal level can be improved. Also, while the cut-off values of the image signal levels for the three color (red, green, blue) channels are controlled by the adders 41, 42, 43, the tracking controls are carried out for the switches 23, 26, 29. As a result, the white balance and the luminance control of the image signals can be simply performed.

In synchronism with the liquid crystal drive apparatus 5, the plasma driver 8 drives the PALC 10 in such a manner that the cathode electrode and also anode electrode of each plasma chamber in this PALC 10 are sequentially switched and scanned along the horizontal direction, so that the plasma chambers are sequentially plasma-discharged, while this liquid crystal drive apparatus 5 drives the transparent electrode of the PALC 10 for each of the horizontal lines.

The above-explained PALC 10 corresponds to such a type of liquid crystal display that each of pixels is driven by utilizing discharge plasma, and also to the plasma addressed liquid crystal display apparatus as disclosed in, for instance, Japanese Laid-open Patent Application No. 1-217396 (opened in 1989) and Japanese Laid-open Patent Application No. 4-265931 (opened in 1992), in which the liquid crystal displays with large screen sizes are manufactured at low cost by high yield to thereby achieve high resolution and also high contrast.

Figure 9:
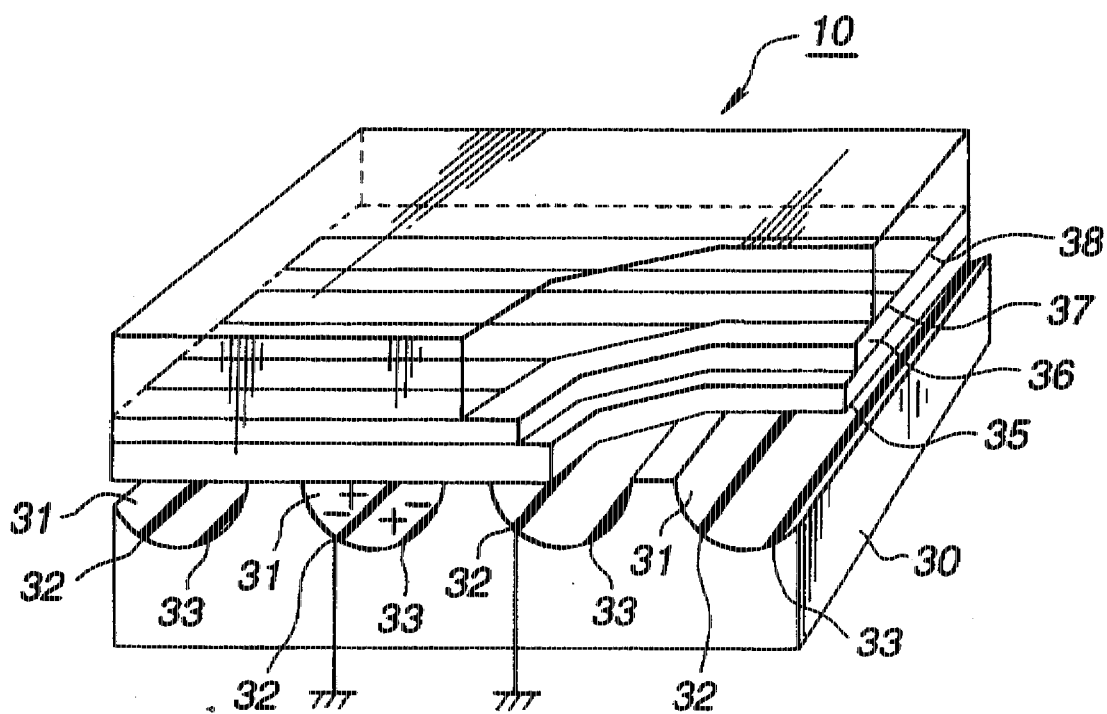
FIG. 9 schematically illustrates a structure of the liquid crystal display employed in the liquid crystal display apparatus of FIG. 1.

As illustrated in FIG. 9, this PALC 10 is constructed in such a way that a plasma chamber 31 fabricated on a glass substrate 30 and a liquid crystal layer 38 made of opto-electric material are located opposite to each other via a thin dielectric sheet 35 made of glass and the like. This plasma chamber 31 is constructed by forming a plurality of parallel grooves in an upper surface of the glass substrate 30. For example, 450 grooves are fabricated into which ionizable gas such as helium, neon, argon or a gas mixture thereof is filled. A pair of anode electrode 32 and cathode electrode 33 are provided in the grooves, and these anode/cathode electrodes 32/33 are located in parallel thereto so as to ionize the gas filled in the plasma chamber 31 to thereby produce the discharge plasma. On the other hand, the liquid crystal layer 36 is sandwiched by the dielectric sheet 35 arranged on the upper surface of the glass substrate 30 and a color filter 37 on which three (red, green, blue) polarization filters. Then, for instance, 785 transparent electrodes 38 are arranged on this color filter 37 every 1 horizontal line on the parallel lines located perpendicular to the plasma chamber 31 constituted by the grooves. The intersected portions between these transparent electrode 38 and plasma chamber 31 may function as pixels of 450×788. The back light is so arranged that the overall display screen of the PALC 10 is illuminated by the light while this back light faces the transparent electrode 38 via the color filter 37 from the glass substrate 30.

In the above-explained PALC 10, while the liquid crystal drive apparatus 5 drives the transparent electrodes 38 of the respective pixels for the respective horizontal lines based on, e.g., 60 V of the image signal levels for the respective pixels in full scale, the respective plasma chambers 31 of this PALC 10 are sequentially driven by the plasma driver 8 in synchronism with the drive operation of the liquid crystal drive apparatus 5 in such a manner that while the anode electrode 32 is set at the ground potential and the cathode electrode is set at −300 V, the horizontal lines are sequentially switched and scanned. As a result, the plasma chambers 31 are successively plasma-discharged, and the image signal levels are sequentially held by the respective pixels arranged on the horizontal lines. Similarly, the image signal levels are sequentially held by the respective pixels for the respective horizontal lines, and the image signal is updated every 1 frame to display the image.

Next, a description will now be made of another liquid crystal display apparatus according to a second embodiment of the present invention with reference to drawings. It should be understood that the same reference numerals shown in the first embodiment will be employed as those for denoting the same or similar constructive members, and therefore, explanations thereof are omitted.

Figure 10:
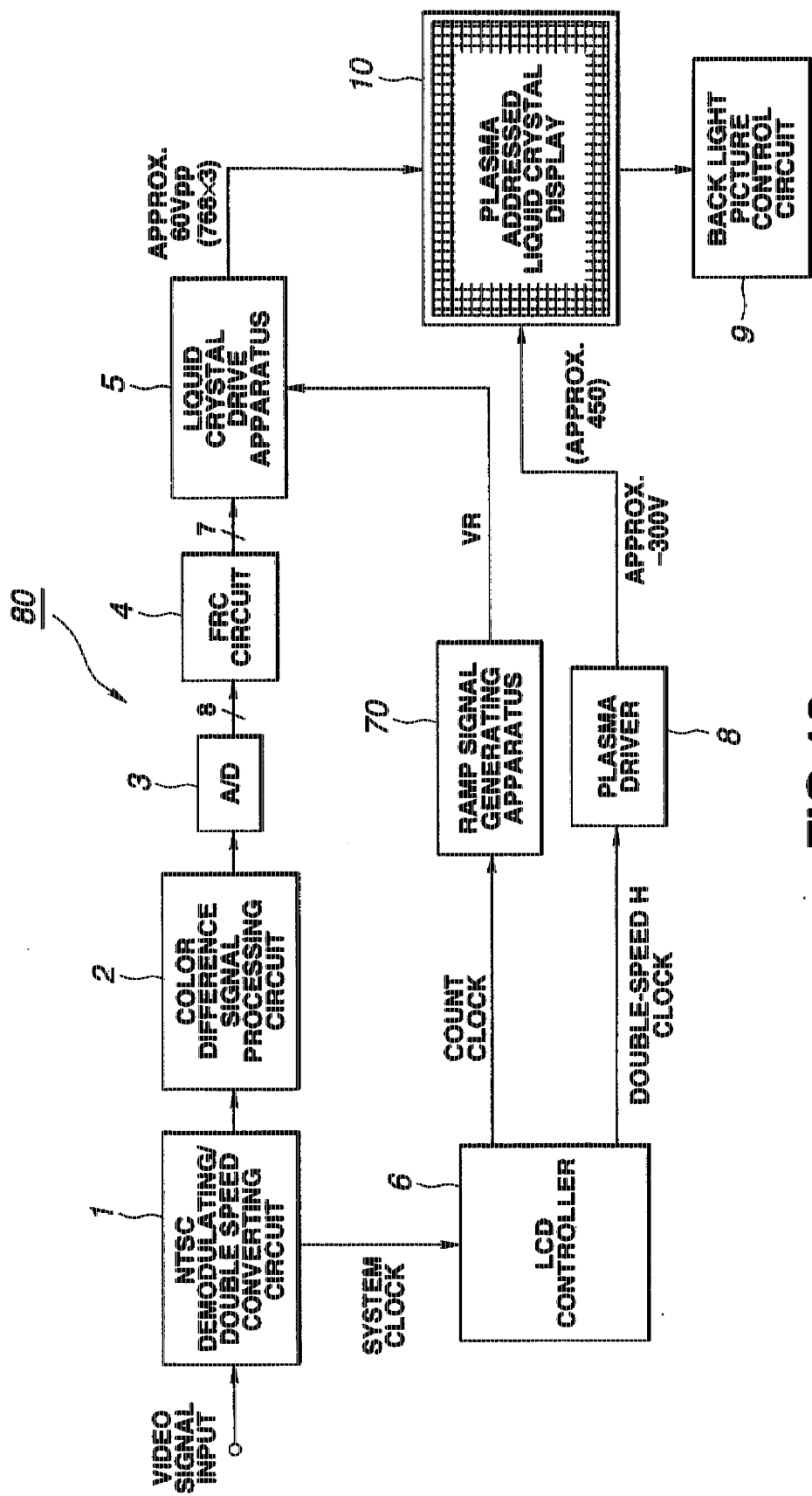
FIG. 10 is a schematic block diagram for indicating a liquid crystal display apparatus according to a second embodiment of the present invention.

The above-described liquid crystal display apparatus 80 is comprised of, as indicated in FIG. 10, an NTSC demodulating/double speed converting circuit 1 to which an image (video) signal is supplied, a color difference signal processing circuit 2 for converting the video signal supplied from the NTSC demodulating/double speed converting circuit 1 into RGB signals, an A/D converter 3 for A/D-converting the RGB signals supplied from the color difference signal processing circuit 2 into the corresponding RGB digital signals, an FRC circuit 4 for converting the frame rate of the RGB digital signals derived from the A/D converter 3, and a liquid crystal display drive apparatus 5 for driving the respective pixels of the PALC 10 for each of the horizontal lines in response to the RGB signals supplied from the FRC circuit 4. This liquid crystal display apparatus is further arranged by an LCD controller 6 for producing a clock signal in synchronism with the video signal supplied from the NTSC demodulating/double speed converting circuit 1, a ramp signal producing apparatus 70 for producing a ramp signal in response to the clock signal, a plasma driver 8 for driving the respective pixels of the PALC 10 every horizontal line in response to this clock signal, a back light picture control circuit 9 for controlling or adjusting illuminance of back light of the PALC 10, and also the PALC (plasma addressed liquid crystal display) 10 driven by the above-explained liquid crystal drive apparatus 5 and plasma driver 8, and for displaying an image thereon while controlling illuminance of the back light by the picture control circuit 9.

Figure 11:
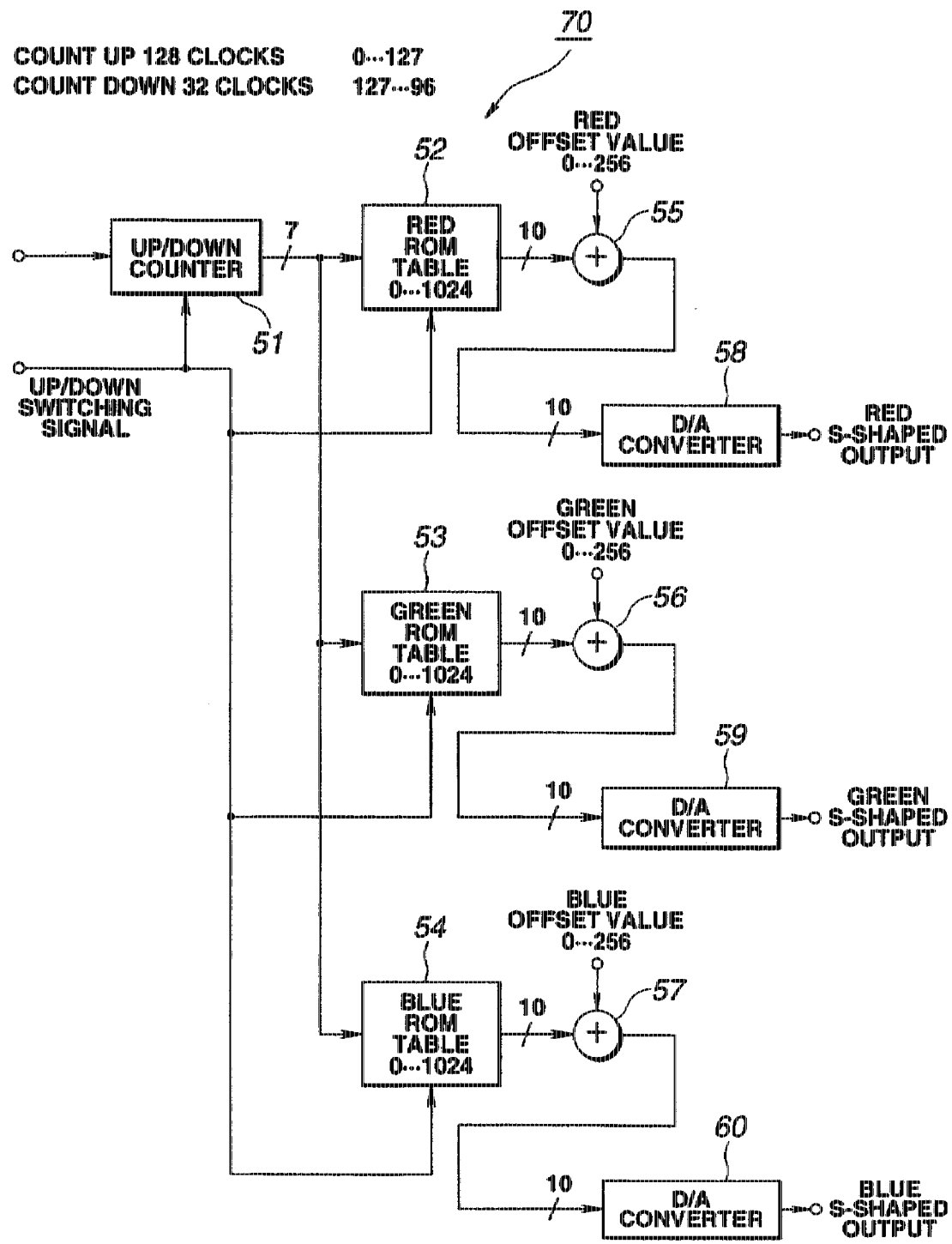
FIG. 11 is a schematic block diagram for showing a major portion of a ramp signal producing apparatus employed in the liquid crystal display apparatus according to the second embodiment.

As indicated in FIG. 11, the ramp signal producing apparatus 70 includes an up/down counter 51 for counting up the count clock signal supplied from the LCD controller 6 when the up/down signal is under HIGH state and for counting down this count clock signal when the up/down signal is under LOW state; red/green/blue ROM tables 52/53/54 for previously storing the corrected image signals which are obtained by correcting the respective RGB image signal levels of the respective pixels in accordance with the count value of the up/down counter 51; adders 55/58/57 for adding the respective RGB offset values of the respective pixels with respect to the count values to the corrected image signals read from the red/green/blue ROM tables 52/53/54; and also D/A converters 58/59/80 for D/A-converting the output signals from the adders 55/58/57 into the analog output signals which will then be supplied as the ramp signal to the liquid crystal drive apparatus 5.

The above-explained up/down signal is formed in such a manner that during the charge period and the hold period for each horizontal period, this up/down signal is in the HIGH state, whereas during the discharge period and the charge period for the each horizontal period, this up/down signal is in the LOW state.

The up/down counter 51 counts up the count clock derived from the LCD controller 6 while the up/down signal is in the HIGH state, and holds the count value after the count up operation. When the up/down signal is in the LOW state, this up/down counter 51 counts down this count clock. This up/down counter 51 may functions as an up/down counter.

In the red ROM table 52, the corrected image signals as to the respective applied voltages are stored, these corrected image signals are produced as follows. As indicated in FIG. 6, a transmittance characteristic of red light of the liquid crystal display unit of the PALC 10 with respect to the applied voltage is multiplied by such a voltage indicative of the S-shaped characteristic with regard to this applied voltage (see FIG. 7), so that the transmittance of the red light with respect to this applied voltage is set to such a linear characteristic as shown in FIG. 8 and thus, the image signal level becomes high resolution. When the count down operation is performed, this corrected image signal is set in such a manner that a change amount of an amplitude with respect to a change in the count value of the up/down counter 51 becomes four times higher than that when the count up operation is carried out. This red ROM table 52 may function as an amplitude value memory of the amplitude amount converting means and the S-shaped correction memory.

In the green and blue ROM tables 53 and 54, the corrected image signals as to the respective applied voltages are stored, these corrected image signals are produced as follows. As indicated in FIG. 8, a transmittance characteristic of green and blue lights of the liquid crystal display unit of the PALC 10 with respect to the applied voltage is multiplied by such a voltage indicative of the S-shaped characteristic with regard to this applied voltage (see FIG. 7), so that the transmittance of the green and blue lights with respect to this applied voltage is set to such a linear characteristic as shown in FIG. 8 and thus, the image signal level becomes high resolution. When the count down operation is performed, this corrected image signal is set in such a manner that a change amount of an amplitude with respect to a change in the count value of the up/down counter 51 becomes four times higher than that when the count up operation is carried out. These green and blue ROM tables 53 and 54 may function as an amplitude value memory of the amplitude amount converting means and the S-shaped correction memory.

In the ramp signal producing apparatus 70 with the above-described circuit arrangement, when the frequency of the clock count signal is selected to be, for example, 7.5 MHz, the counting time for 128 pieces of the clock count signals is 17 µs during the count up operation, whereas the counting time for 32 pieces of the clock count signals is 4 µs during the count down operation. Accordingly, the discharging period of the liquid crystal drive apparatus 5 is less than ¼ of the charging period thereof.

The D/A converters 58, 59, 80 may function as the ramp signal producing means.

As described above, in accordance with the ramp signal producing apparatus 70, the frequency of the clock signal supplied to the up/down counter during the count down operation may be set to such a low frequency equal to the frequency of the clock signal during the count up operation. As a consequence, this ramp signal producing apparatus 70 can be manufactured in low cost by employing the usual semiconductor manufacturing process whose manufacturing steps are small. Also, no spurious radiation is emitted from the ramp signal producing apparatus 70 to make up the high quality image of the liquid crystal display apparatus. Further, since the structure for cutting the spurious radiation is no longer required, the overall arrangement can be made cheap and simple.

In the ramp signal producing apparatus 70, the image signal level is corrected by the S-shaped correcting manner based upon the corrected image signals stored in the red/green/blue ROM tables 52/53/54, so that the transmittance characteristic of the PALC 10 is made linear and thus the resolution of the image signal level can be improved. Also, while the cut-off values of the image signal levels for the three color (red, green, blue) channels are controlled by the adders 55, 56, 57, the tracking controls are carried out for the D/A converters 58, 59, 60. As a result, the white balance and the luminance control of the image signals can be simply performed.

It should also be noted that, although the plasma addressed liquid crystal display apparatuses have been employed as the liquid crystal display in the above-described embodiments, the present invention is not limited to such a liquid crystal display, but may be applied to, for instance, an active matrix type liquid crystal display in which active elements such as transistors are provided with transparent electrodes of pixels arranged in a matrix form, and these active elements are driven.

As previously described in detail, in accordance with the ramp signal producing method of the present invention, when the count down operation is carried out in the amplitude amount converting step, the switching operation is performed in such a manner that the amount of amplitude changes is increased with respect to the count value, and in the ramp signal producing step, the ramp signal whose amplitude is varied in response to this count value. In this manner, while the frequency of the clock signal is selected to be the low frequency during the count down operation, it is possible to provide the ramp signal producing method capable of suppressing the spurious radiation.

Also, in accordance with the ramp signal producing apparatus of the present invention, while the count down operation is performed by the up/down counter, the amplitude amount converting means selects that the amount of amplitude changes with respect to the count value of this up/down counter are increased, so that such a ramp signal whose amplitude is varied in response to this count value is produced by the ramp signal producing means. As described above, when the count down operation is carried out, the clock signal supplied to the up/down counter need not be modulated by the high frequency. As a consequence, it is possible to provide such a ramp signal producing apparatus manufactured in low cost by the usual semiconductor manufacturing process with less manufacturing steps. Also, since the liquid crystal display apparatus can display the image with high quality without emitting spurious radiation and further the structure for cutting this spurious radiation is no longer required, it is possible to provide such a simple ramp signal producing apparatus in low cost.

According to the liquid crystal drive apparatus of the present invention, the amplitude of the ramp signal is corrected by the S-shaped correction as the linear shape by the amplitude amount converting means, so that the resolution of the image signal level is increased, and both of the white balance and the luminance of the image signal levels can be controlled based upon the offset value. As a consequence, it is possible to provide such a liquid crystal display apparatus in low cost.

Also, in accordance with the liquid crystal display apparatus of the present invention, while the count down operation is performed by the up/down counter, the amplitude amount converting means selects that the amount of amplitude changes with respect to the count value of this up/down counter are increased, so that such a ramp signal whose amplitude is varied in response to this count value is produced by the ramp signal producing means. The amplitude of the ramp signal is corrected by the S-shaped correction as the linear shape by the amplitude amount converting means, so that the resolution of the image signal level is increased, and both of the white balance and the luminance of the image signal levels can be controlled based upon the offset value. As a consequence, it is possible to provide such a liquid crystal display apparatus with the simple circuit arrangement, capable of realizing the high image quality in low cost.

What is claimed is:

1. A method for producing a ramp signal comprising the steps of:

counting up or down a supplied clock signal to obtain a count value;

converting the amplitude of said supplied clock signal into an amplitude value in accordance with the count value; and converting said amplitude value in such a manner that a change amount per one count value is increased during the counting down step; and producing a ramp signal whose amplitude is changed in response to said amplitude value.

2. A ramp signal producing method as claimed in claim 1 wherein:

during said converting step, the count value is shifted in a bit shift mode during the counting down step so as to increase the count value, whereby the change amount of the amplitude value is increased.

3. A ramp signal producing method as claimed in claim 1 wherein:

during said converting step, the amplitude values for the respective count values are read out from an amplitude value memory into which the amplitude values for the respective count values are stored during the counting up step and the counting down step in such a manner that the amplitude value with respect to the count value is increased during the counting down operation in said count step.

4. A ramp signal producing apparatus comprising:

an up/down counter for counting up or down a supplied clock signal to obtain a count value;

amplitude amount converting means for converting the amplitude of said supplied clock signal into an amplitude value corresponding to the count value and for converting said amplitude value in such a manner that a change amount per one count value is increased during the counting down operation by said up/down counter; and ramp signal producing means for producing a ramp signal with an amplitude corresponding to said amplitude value.

5. A ramp signal producing apparatus as claimed in claim 4 wherein:

said amplitude amount converting means includes bit shift means for shifting the count value in a bit shift mode during the counting down operation by said up/down counter for increasing the count value, whereby the change amount of the amplitude value is increased.

6. A ramp signal producing apparatus as claimed in claim 4 wherein:

said amplitude amount converting means includes an amplitude value memory into which the amplitude values for the respective count values have been stored during the counting up operation by the up/down counter and the counting down operation, and reading out means for reading the amplitude values from said amplitude value memory corresponding to the respective count values.

* * * * *